(12) United States Patent
Sawa et al.

(10) Patent No.: US 8,950,936 B2
(45) Date of Patent: Feb. 10, 2015

(54) NAIL PUNCTURE TEST DEVICE HAVING TEMPERATURE MEASUREMENT FUNCTION

(75) Inventors: Masaji Sawa, Saitama (JP); Naoki Maruno, Saitama (JP); Masaru Yamana, Hyogo (JP)

(73) Assignees: Honda Motor Company Limited, Tokyo (JP); Okazaki Manufacturing Company, Hyogo (JP)

( * ) Notice: Subject to any disclaimer, the term of this patent is extended or adjusted under 35 U.S.C. 154(b) by 378 days.

(21) Appl. No.: 13/383,110

(22) PCT Filed: Jul. 10, 2009

(86) PCT No.: PCT/JP2009/063133
§ 371 (c)(1),
(2), (4) Date: Jan. 9, 2012

(87) PCT Pub. No.: WO2011/004506
PCT Pub. Date: Jan. 13, 2011

(65) Prior Publication Data
US 2012/0134388 A1    May 31, 2012

(51) Int. Cl.
*G01K 7/02* (2006.01)
*H01M 10/00* (2006.01)
(Continued)

(52) U.S. Cl.
CPC ............... *H01M 10/486* (2013.01); *G01K 1/14* (2013.01); *G01K 7/02* (2013.01); *G01R 31/025* (2013.01); *G01R 31/3627* (2013.01)
USPC ............. 374/179; 374/141; 374/208; 374/57; 374/45; 374/4; 429/90

(58) Field of Classification Search
CPC ..................... H01M 10/4285; H01M 2200/10
USPC ........... 374/179, 163, 208, 141, 4, 45–48, 57, 374/100
See application file for complete search history.

(56) References Cited

U.S. PATENT DOCUMENTS 4,822,700 A * 4/1989 Doddapaneni et al. ......... 429/50
4,904,091 A * 2/1990 Ward ............................. 374/179
(Continued)

FOREIGN PATENT DOCUMENTS

JP         02001210361 A * 8/2001
JP          2001210361 A * 8/2001
(Continued)

OTHER PUBLICATIONS

International Search Report for PCT/JP2009/063133; Oct. 20, 2009.

*Primary Examiner* — Gail Kaplan Verbitsky
(74) *Attorney, Agent, or Firm* — Pearne & Gordon LLP

(57) ABSTRACT

In a prior-art nail puncture test, it has been difficult to measure the temperature at a short-circuiting portion, which is closely related to the scale of an accident which occurs. As a solution, A nail puncture test device having a temperature measurement function, a sheath thermocouple, and a fixing portion 6 of the sheath thermocouple, wherein a bottomed hole through which the sheath thermocouple is inserted is bored in the axial direction from a head portion to the vicinity of the distal end at the center part of the outer frame, and the sheath thermocouple is fixed to the outer frame by the fixing portion 6 in a state where the sheath thermocouple is inserted into the bottomed hole and the distal end thereof having a temperature measurement point is in contact with the bottom of the hole is provided.

2 Claims, 1 Drawing Sheet

(51) Int. Cl.
 *H01M 10/48* (2006.01)
 *G01K 1/14* (2006.01)
 *G01R 31/02* (2006.01)
 *G01R 31/36* (2006.01)

(56) References Cited

U.S. PATENT DOCUMENTS

| | | | |
|---|---|---|---|
| 4,984,904 A * | 1/1991 | Nakano et al. | 374/139 |
| 5,663,007 A * | 9/1997 | Ikoma et al. | 429/53 |
| 5,999,081 A * | 12/1999 | Hannigan et al. | 338/28 |
| 6,203,114 B1 * | 3/2001 | Ehrlich | 301/124.1 |
| 6,367,974 B1 * | 4/2002 | Lin | 374/179 |
| 6,536,950 B1 * | 3/2003 | Green et al. | 374/179 |
| 6,833,707 B1 * | 12/2004 | Dahn et al. | 324/426 |
| 6,964,518 B1 * | 11/2005 | Jagtøyen | 374/154 |
| 8,100,583 B2 * | 1/2012 | Conner et al. | 374/179 |
| 8,647,762 B2 * | 2/2014 | Schwab et al. | 429/99 |
| 8,663,832 B2 * | 3/2014 | Abe et al. | 429/129 |
| 2006/0188769 A1 * | 8/2006 | Bernard et al. | 429/34 |
| 2007/0234818 A1 * | 10/2007 | Weppenaar et al. | 73/761 |
| 2011/0068800 A1 * | 3/2011 | Nishino et al. | 324/426 |
| 2012/0214037 A1 * | 8/2012 | Hara et al. | 429/94 |
| 2013/0127473 A1 * | 5/2013 | Ikeda | 324/426 |

FOREIGN PATENT DOCUMENTS

| | | | |
|---|---|---|---|
| JP | 2003-317804 A | | 11/2003 |
| JP | 2005-32842 A | | 2/2005 |
| JP | 2005-222744 A | | 8/2005 |
| JP | 2006-269171 A | | 10/2006 |
| JP | 2009-87600 A | | 4/2009 |
| JP | 2010238435 A | * | 10/2010 |

* cited by examiner

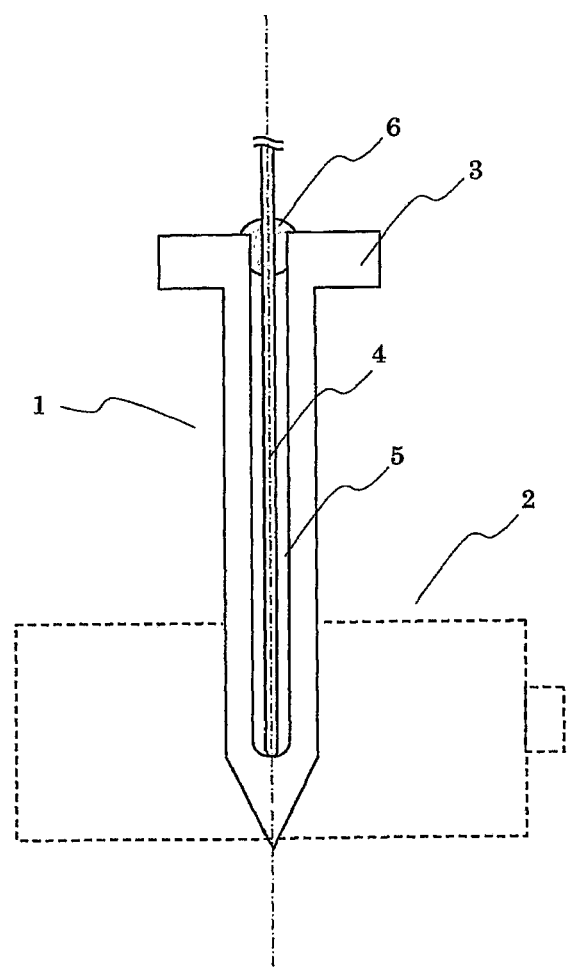

NAIL PUNCTURE TEST DEVICE HAVING TEMPERATURE MEASUREMENT FUNCTION

TECHNICAL FIELD

The present invention relates to a nail puncture test device having a temperature measurement function.

BACKGROUND ART

If electrical short-circuit occurs inside a battery with high energy density such as a lithium ion battery, abnormal heat generation is caused depending on the structure, and an accident such as a burn, a fire or the like can occur.

Thus, in a battery with high energy density such as a lithium ion battery, such a test is conducted that the battery is punctured by a nail made of metal so as to destroy an insulating bulkhead inside and to cause internal short-circuit and to check that heat generation or ignition resulting in the accident does not occur. This test is called a nail puncture test.

CITATION LIST

Patent Literature

Patent Document 1: Japanese Patent Laid-Open No. 2005-327616

SUMMARY OF INVENTION

Technical Problem

In the prior-art nail puncture test, as described above, a battery to be tested is punctured by a nail made of metal so as to cause short-circuit inside the battery. In this test, in many cases, a temperature sensor such as a thermocouple is installed on the battery to be tested in order to measure the amount of heat generated at the time of short-circuit, but if the sensor is installed inside the battery to be tested, the sensor itself might become a source of the short-circuit. Also, since the internal structure of the battery to be tested changes, an installed position of the temperature sensor is limited to the surface of the battery or the like. Thus, it has been difficult to measure the temperature at a short-circuiting portion, which is closely related to the scale of an accident which occurs.

Solution to Problem

In order to facilitate measurement of a temperature at a short-circuiting portion, which is closely related to the scale of the accident which occurs, the present invention provides a nail puncture test device having a temperature measurement function as shown in FIG. 1, comprising an outer frame 3 made of a high-hardness metal or ceramic and having the external shape of a nail, a sheath thermocouple 4, and a fixing portion 6 of the sheath thermocouple 4, wherein a bottomed hole 5 through which the sheath thermocouple 4 is inserted is bored in an axial direction from a head portion to the vicinity of a distal end at a center part of the outer frame 3, and the sheath thermocouple 4 is fixed to the outer frame 3 through the fixing portion 6 in a state where the sheath thermocouple 4 is inserted into the bottomed hole 5 and a distal end thereof having a temperature measurement point is in contact with the bottom of the hole.

Also, the present invention is the nail puncture test device having a temperature measurement function described in claim 1, specifically in which the fixing portion 6 of the sheath thermocouple 4 is fixed by silver brazing, fixed by using an elastic resin plug having the sheath thermocouple 4 inserted through a central hole thereof as the fixing portion 6 and pressing it into the outer frame 3, or fixed by inorganic cement.

Advantageous Effects of Invention

Since the nail and the temperature sensor are constructed integrally in the present invention which is the nail puncture test device having a temperature measurement function, comprising the outer frame 3 made of high-hardness metal or ceramic and having the external shape of a nail, the sheath thermocouple 4, and the fixing portion 6 of the sheath thermocouple 4, wherein the bottomed hole 5 into which the sheath thermocouple 4 is inserted is bored in the axial direction from the head portion to the vicinity of the distal end at the center part of the outer frame 3, and the sheath thermocouple 4 is fixed to the outer frame 3 by the fixing portion 6 in the state where the sheath thermocouple 4 is inserted into the bottomed hole 5 and the distal end thereof having a temperature measurement point is in contact with the bottom of the hole, internal short-circuit in the battery to be tested can be made to occur and the temperature of the short-circuiting portion can be measured with only one testing device of the present invention.

Also, in the present invention, the temperature measurement of the internal short-circuiting portion of the battery to be tested is made possible in the nail puncture test by constructing the nail and the temperature sensor integrally.

Moreover, in the present invention, since a sheath thermocouple wire is contained in the sheath through an insulating article, the sheath thermocouple is not affected by the electric potential of the external battery to be tested and the electric potential of the outer frame made of metal. Therefore, the temperature can be accurately measured.

Furthermore, the sheath thermocouple 4 can be attached in the bottomed hole 5 reliably and easily since the present invention is a nail puncture test device having a temperature measurement function described in claim 1, where the fixing portion 6 of the sheath thermocouple 4 is fixed by silver brazing, fixed by using an elastic resin plug having the sheath thermocouple 4 inserted through a central hole thereof as the fixing portion 6 and pressing it into the outer frame 3, or fixed by inorganic cement.

BRIEF DESCRIPTION OF DRAWINGS

FIG. 1 is a longitudinal sectional diagram illustrating a state where a nail puncture test device of the present invention is inserted into a battery to be tested.

REFERENCE SIGNS LIST 3 outer frame
4 sheath thermocouple
6 fixing portion
5 bottomed hole
1 nail puncture test device

DESCRIPTION OF EMBODIMENTS

The present invention is a nail-shaped test device used for a nail puncture test, in which a nail and a temperature sensor are constructed integrally, thus easy measurement of a temperature at a short-circuiting portion of a battery to be tested, which has been difficult, is enabled.

FIG. 1 illustrates a sectional structure thereof. Reference numeral 1 denotes a nail puncture test device according to the present invention, and a dotted line 2 denotes a battery to be tested which is punctured by the nail puncture test device 1.

The nail puncture test device 1 is formed of an outer frame 3 having the external shape of a nail, a sheath thermocouple 4, and a fixing portion 6 of the sheath thermocouple 4, wherein a bottomed hole 5 into which the sheath thermocouple 4 is inserted is bored in the axial direction from a head portion to the vicinity of the distal end at the center part of the outer frame 3, and the sheath thermocouple 4 is fixed to the outer frame 3 by the fixing portion 6 in a state where the sheath thermocouple 4 is inserted into the bottomed hole 5 and the distal end thereof having a temperature measurement point is in contact with the bottom of the hole.

As the material of the outer frame 3, high-hardness metal or ceramic is used in order to prevent deformation at puncture.

Fixing of the sheath thermocouple 4 at the fixing portion 6 may be fixing by means of silver brazing, fixing by means of using an elastic resin plug having the sheath thermocouple 4 inserted through a central hole thereof as the fixing portion 6 and pressing it into the outer frame 3, or fixing by means of inorganic cement.

The sheath thermocouple 4 contains a pair of thermocouple wires interposing an inorganic insulating material powder such as magnesia, alumina, or the like between them inside a metal pipe called sheath, and the pair of thermocouple wires are bonded inside the sheath distal end to form the temperature measurement point. Though not shown in FIG. 1, at a rear end of the sheath thermocouple 4, the thermocouple wires of the sheath thermocouple 4 and compensating lead wires are connected. The compensating lead wires are connected to an instrument which converts a thermoelectromotive force of the sheath thermocouple 4 to a temperature and records/displays it, and this temperature is the temperature of the short-circuiting portion in the battery to be tested which is measured by the sheath thermocouple 4.

The puncture of the nail puncture test device 1 into the battery 2 to be tested is performed manually by applying an impact to the head portion by means of a hammer or the like or by applying a downward force to the head portion by an exclusive device as in the past, and the hammer or the exclusive device having the shape not interfering with the portion of the sheath thermocouple 4 outside the outer frame 3 made of metal is used.

Example 1

According to FIG. 1, an example of the nail puncture test device 1 according to the present invention will be described below.

The outer frame 3 is made of high-hardness high-speed steel SKI-151 in order to prevent deformation at puncture and to allow repeated use. The shape has a puncturing-part outer diameter of φ2.5 mm, a head-portion outer diameter of φ8.0 mm, an apex angle of a distal-end conical part of 30°, a length from the head portion to the distal end of 42 mm, and a diameter of the sheath thermocouple insertion hole 5 of φ0.35 mm.

The sheath thermocouple 4 having the sheath material of NCF 600, a sheath outer diameter of φ0.3 mm, and a thermocouple wire of K type is used.

Also, the fixing portion 6 of the sheath thermocouple 4 to the outer frame 3, made of metal, is fixed by silver brazing.

It was confirmed that by means of the nail puncture test device 1, occurrence of short-circuit inside the battery to be tested and accurate measurement of the temperature at the short-circuiting portion can be repeatedly performed.

INDUSTRIAL APPLICABILITY

The present invention is a nail puncture test device to puncture the battery to be tested and can be used for a subject to be tested whose internal structure changes.

The invention claimed is:

1. A nail puncture test device for a lithium ion battery having a temperature measurement function, wherein a tip of the nail puncture test device punctures the lithium ion battery to cause an internal short-circuit so as to measure a temperature of a portion of the internal short-circuit comprising
    an outer frame made of a high-hardness metal or ceramic and having an external shape of a nail with a pointed tip, wherein a center part of the outer frame has a bottomed hole bored in an axial direction from a head portion of the outer frame to a vicinity of the tip, and wherein an upper portion of the head portion has a flat portion formed in a direction perpendicular to the axial direction,
    a sheath thermocouple inserted into the bottomed hole of the outer frame, and
    a fixing portion for fixing the sheath thermocouple inserted into the bottomed hole of the outer frame to the outer frame,
    wherein the sheath thermocouple is fixed to the outer frame by the fixing portion in a state where the sheath thermocouple is inserted into the bottomed hole and a distal end thereof having a temperature measurement point is in contact with a bottom of the hole.

2. The nail puncture test device for a lithium ion battery having a temperature measurement function described in claim 1, wherein the fixing portion of the sheath thermocouple is fixed by silver brazing, fixed by using an elastic resin plug having the sheath thermocouple inserted through a central hole thereof as the fixing portion and pressing it into the outer frame, or fixed by inorganic cement.

* * * * *

UNITED STATES PATENT AND TRADEMARK OFFICE
CERTIFICATE OF CORRECTION

| | | |
|---|---|---|
| PATENT NO. | : 8,950,936 B2 | Page 1 of 1 |
| APPLICATION NO. | : 13/383110 | |
| DATED | : February 10, 2015 | |
| INVENTOR(S) | : Masaji Sawa et al. | |

It is certified that error appears in the above-identified patent and that said Letters Patent is hereby corrected as shown below:

In the specification,

Column 3, line 55, please replace "SKI-151" with -- SKH51 --

Signed and Sealed this
Sixteenth Day of June, 2015

Michelle K. Lee
*Director of the United States Patent and Trademark Office*